United States Patent
Raghu et al.

(10) Patent No.: US 9,240,238 B2
(45) Date of Patent: *Jan. 19, 2016

(54) BACK GATE OPERATION WITH ELEVATED THRESHOLD VOLTAGE

(71) Applicant: SanDisk Technologies Inc., Plano, TX (US)

(72) Inventors: Deepak Raghu, Milpitas, CA (US); Gautam Dusija, Milpitas, CA (US); Chris Avila, Saratoga, CA (US); Yingda Dong, San Jose, CA (US); Man Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 95 days.

This patent is subject to a terminal disclaimer.

(21) Appl. No.: 14/033,100

(22) Filed: Sep. 20, 2013

(65) Prior Publication Data

US 2015/0085574 A1  Mar. 26, 2015

(51) Int. Cl.
*G11C 16/04* (2006.01)
*G11C 16/10* (2006.01)
*G11C 11/56* (2006.01)
*G11C 16/34* (2006.01)

(52) U.S. Cl.
CPC ........ *G11C 16/0483* (2013.01); *G11C 11/5628* (2013.01); *G11C 16/10* (2013.01); *G11C 16/3427* (2013.01)

(58) Field of Classification Search
CPC ............................ G11C 16/0483; G11C 16/10
USPC ............................ 365/185.11, 185.17, 185.18
See application file for complete search history.

(56) References Cited

U.S. PATENT DOCUMENTS

| | | | |
|---|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |

(Continued)

FOREIGN PATENT DOCUMENTS

| WO | WO 2011019602 | 2/2011 |
|---|---|---|
| WO | WO 2012039511 | 3/2012 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Huan Hoang
(74) *Attorney, Agent, or Firm* — Davis Wright Tremaine LLP

(57) ABSTRACT

In a three dimensional NAND memory, increased threshold voltages in back gate transistors may cause program failures, particularly along word lines near back gates. When back gate transistor threshold voltages cannot be returned to a desired threshold voltage range then modified program conditions, including increased back gate voltage, may be used to allow programming.

18 Claims, 14 Drawing Sheets

(56) References Cited

U.S. PATENT DOCUMENTS

| | | |
|---|---|---|
| 7,518,919 B2 | 4/2009 | Gonzalez et al. |
| 7,839,685 B2 | 11/2010 | Auclair et al. |
| 2005/0122779 A1 | 6/2005 | Fasoli et al. |
| 2007/0263439 A1 | 11/2007 | Cornwell et al. |
| 2009/0168533 A1 | 7/2009 | Park et al. |
| 2009/0204824 A1 | 8/2009 | Lin et al. |
| 2009/0268524 A1 | 10/2009 | Maejima |
| 2010/0097858 A1 | 4/2010 | Tokiwa et al. |
| 2010/0322000 A1 | 12/2010 | Shim et al. |
| 2011/0131473 A1 | 6/2011 | Mokhlesi et al. |
| 2011/0149651 A1 | 6/2011 | Gorobets et al. |
| 2011/0182119 A1 | 7/2011 | Strasser et al. |
| 2011/0188307 A1 | 8/2011 | Kito et al. |
| 2012/0051137 A1 | 3/2012 | Hung et al. |
| 2012/0176836 A1 | 7/2012 | Iguchi et al. |
| 2012/0220088 A1 | 8/2012 | Alsmeier |
| 2012/0243326 A1 | 9/2012 | Maeda |
| 2012/0320678 A1 | 12/2012 | Maejima et al. |
| 2013/0055012 A1 | 2/2013 | Roh |
| 2013/0058165 A1 | 3/2013 | Maejima et al. |
| 2013/0070528 A1 | 3/2013 | Maeda |
| 2013/0073924 A1 | 3/2013 | D'Abreu et al. |
| 2013/0107628 A1 | 5/2013 | Dong et al. |
| 2013/0201760 A1 | 8/2013 | Dong et al. |
| 2015/0003161 A1 * | 1/2015 | Avila et al. ............... 365/185.17 |
| 2015/0085574 A1 | 3/2015 | Raghu et al. |

OTHER PUBLICATIONS

Technical Search Report, May 16, 2013, 8 pages.

U.S. Appl. No. 13/927,659 entitled "System for Maintaining Back Gate Threshold Voltage in Three Dimensional NAND Memory," filed Jun. 26, 2013, 41 pages.

Non-final Office Action issued in U.S. Appl. No. 13/927,659, mailed on May 8, 2015, 19 pages.

Notice of Allowance issued in U.S. Appl. No. 13/927,659, mailed Nov. 10, 2015, 9 pages.

* cited by examiner

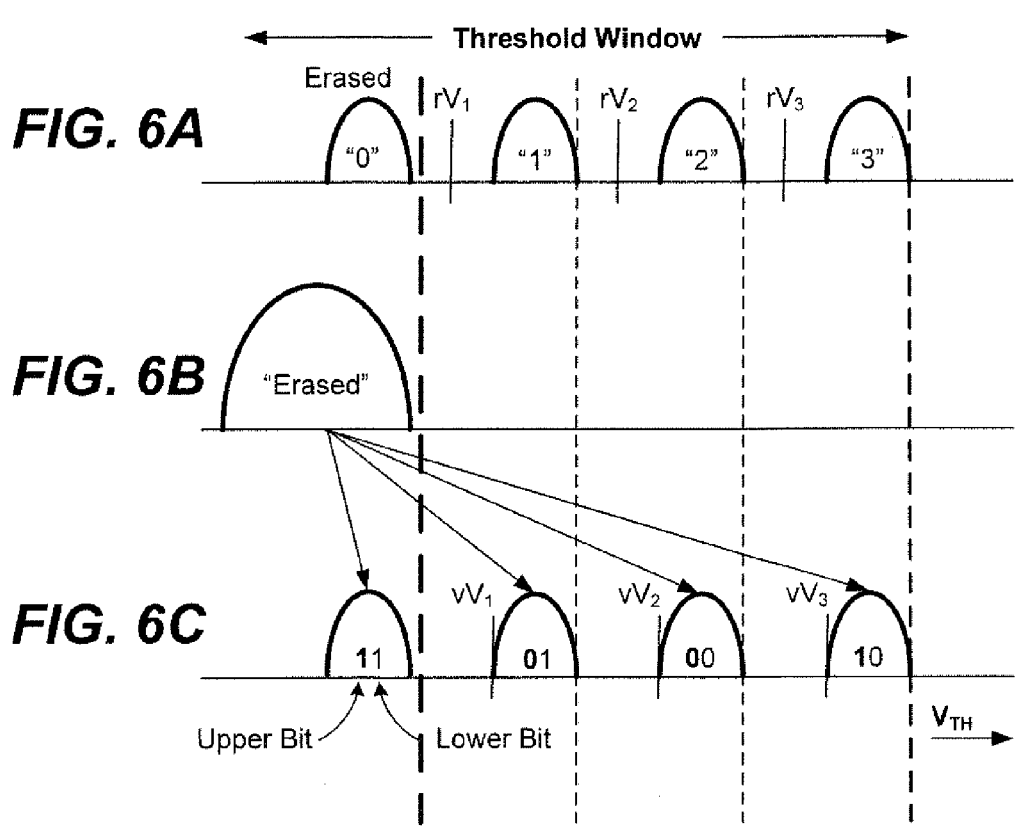
Programming into four states represented by a 2-bit code

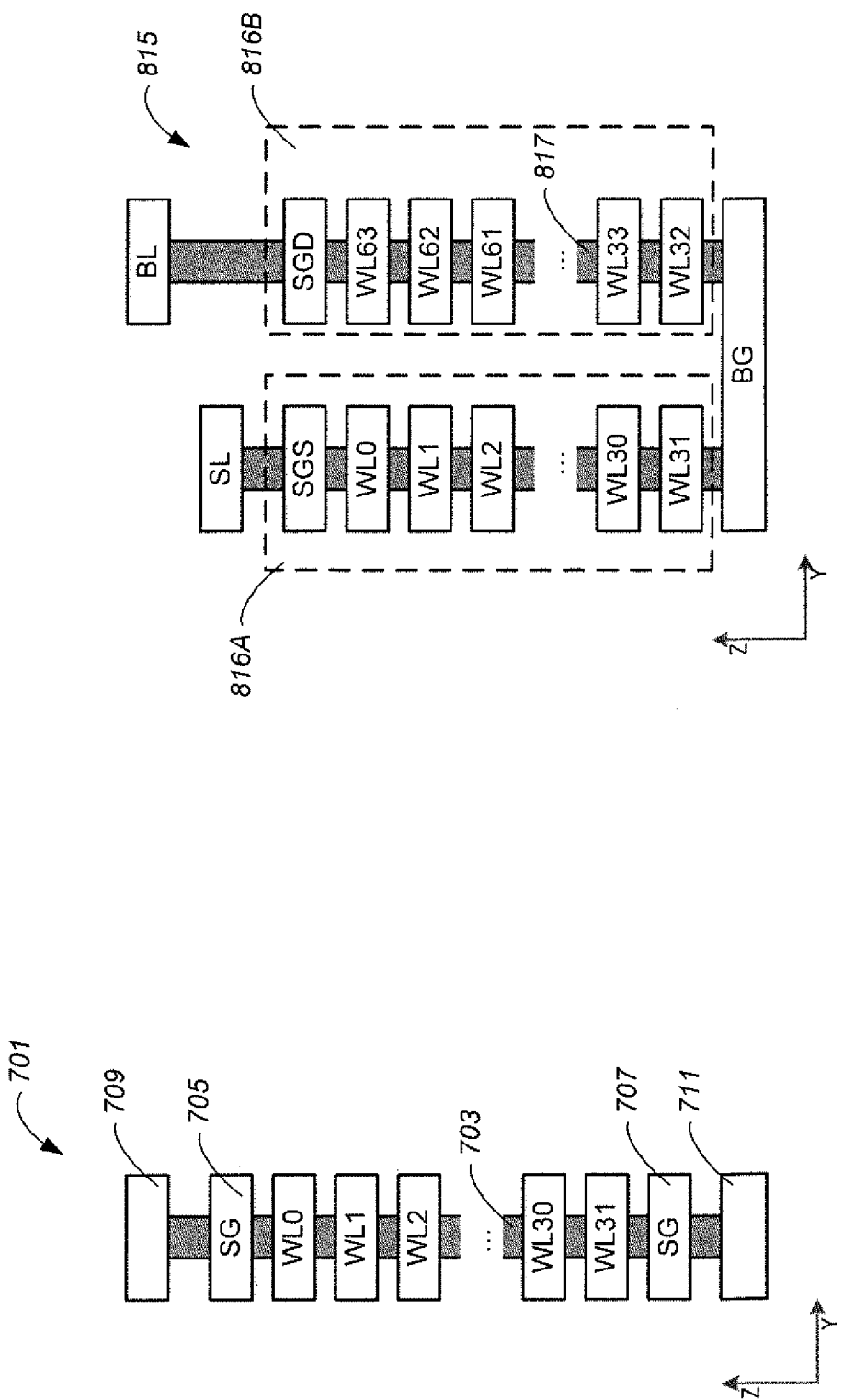

BACK GATE OPERATION WITH ELEVATED THRESHOLD VOLTAGE

BACKGROUND

This application relates to the operation of re-programmable nonvolatile three dimensional memory systems such as semiconductor flash memory system which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold voltage window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In some three dimensional NAND memory arrays, a back gate transistor is provided in each NAND string to connect two wings of the NAND string. Such back gate transistors may include a charge trapping layer that affects their threshold voltages. Threshold voltages may change with use. High threshold voltages in back gate transistors may result in programming failures, particularly when programming along word lines near the back gate that are between the back gate and a source line. Threshold voltages may be returned to the desired range in an operation that is similar to an erase. After significant use it may not be possible to return threshold voltages to the desired range (e.g. because of erase saturation in back gate transistors). In this case, programming parameters may be modified to accommodate the higher threshold voltages. For example, a voltage applied to the back gate may be increased from a default voltage to a higher modified voltage so that back gate transistors that would not be turned on by the default voltage are turned on by the higher modified voltage.

An example of a method of operating a block of a three dimensional nonvolatile memory array includes: applying a first set of programming conditions that includes a first back gate voltage that is applied to a back gate of the block for programming operations during a first period of operation; performing one or more back gate tuning operations on the back gate of the block to maintain threshold voltage of a back gate transistor in a target range; subsequently determining that the threshold voltage of the back gate transistor remains higher than the target range after back gate tuning; and subsequently, replacing the first set of programming conditions with a second set of programming conditions that includes a second back gate voltage that is applied to the back gate of the block for programming operations during a second period of operation, the second back gate voltage being larger than the first back gate voltage.

The first back gate voltage may be applied to the back gate when programming one or more word lines near the back gate that are located between the back gate and a source line during the first period of operation. The second back gate voltage may be applied to the back gate when programming the one or more word lines near the back gate that are located between the back gate and a source line, during the second period of operation. The first set of programming conditions may be maintained for as long as the threshold voltage of the back gate transistor is found to be within the target range immediately after a back gate tuning operation. One or more back gate tuning operations may be performed on the back gate of the block to maintain threshold voltage of the back gate in a modified target range during the second period of operation. The threshold voltage of the back gate transistor may be determined to be higher than the modified target range after back gate tuning; and the second set of programming conditions may be replaced with a third set of programming conditions that includes a third back gate voltage that is applied to the back gate of the block for programming operations during a third period of operation, the third back gate voltage being larger than the second back gate voltage. The first back gate voltage may be insufficient to turn on back gate transistors with threshold voltages within the modified target range, and the second back gate voltage may be insufficient to turn on back gate transistors with threshold voltages higher than the modified target range. The first set of programming conditions may be optimized to produce a low Bit Error Rate (BER) in a new memory array and the second set of programming conditions may not be optimized to produce a low BER in a new memory. The second set of programming conditions may allow programming of data along word lines that cannot be programmed using the first set of programming conditions after a period of use of the memory array.

An example of a method of operating a block of a three dimensional nonvolatile memory array includes: applying a default set of programming conditions that includes a first back gate voltage that is applied to a back gate of the block for programming cells along word lines near the back gate during a first period of operation; subsequently determining that the threshold voltages of the back gate transistors are higher than a target range; and subsequently, replacing the default set of programming conditions with a modified set of programming conditions that includes a second back gate voltage that is applied to the back gate of the block for programming cells along word lines near the back gate during a second period of operation, the second back gate voltage being larger than the first back gate voltage.

The first back gate voltage may be sufficient to turn on back gate transistors that have threshold voltages within the target range and may be insufficient to turn on back gate transistors that have threshold voltages higher than the target range. The second back gate voltage may be sufficient to turn on back gate transistors that have threshold voltages higher than the target range. One or more back gate transistor threshold voltage modification operations may be performed to maintain threshold voltage of back gate transistors within the target range. Prior to replacing the default set of programming conditions, a pattern of programming failures when programming word lines near the back gate that are located between the back gate and a source line may be identified.

An example of a three dimensional nonvolatile memory system includes: a plurality of NAND strings that individually include two wings that each extend in a direction perpendicular to a surface of a substrate, the two wings connected by a back gate transistor; a back gate that forms a common gate terminal for all back gate transistors of a block; and a back gate control circuit that controls a voltage applied to the back gate, the back gate control circuit configured to supply a first boosting voltage to the back gate during programming in a first period of operation of the block and configured to supply a second boosting voltage to the back gate during programming in a subsequent second period of operation of the block, the second boosting voltage being higher than the first boosting voltage.

The back gate control circuit may be configured to supply the first and second boosting voltages to the back gate during programming of word lines near the back gate that are between the back gate and a source line. A back gate threshold voltage modification circuit that may be configured to modify threshold voltages of back gate transistors. A back gate threshold voltage resolving circuit may be configured to resolve threshold voltages of back gate transistors.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes.

To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

DETAILED DESCRIPTION

Memory System

Figure 1:
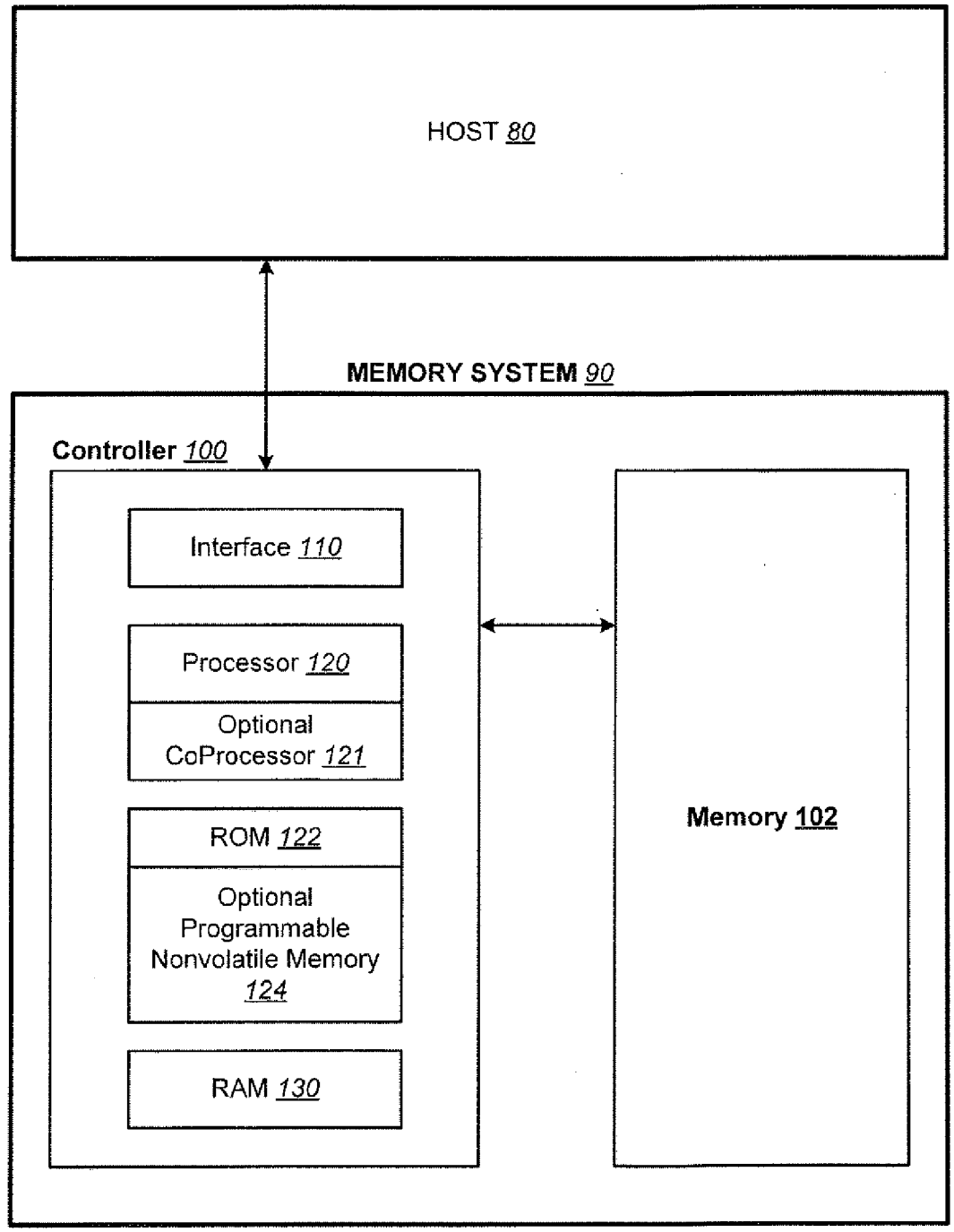
FIG. 1. illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
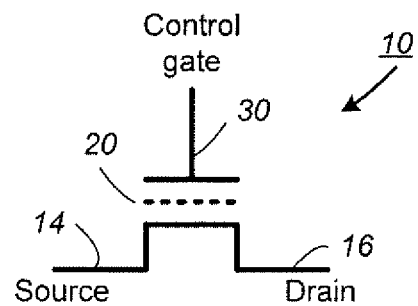
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
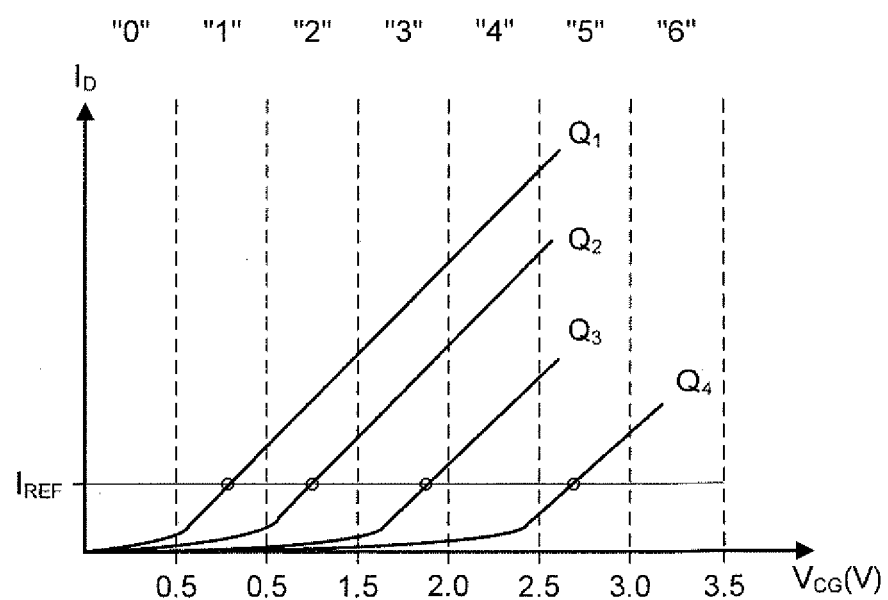
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
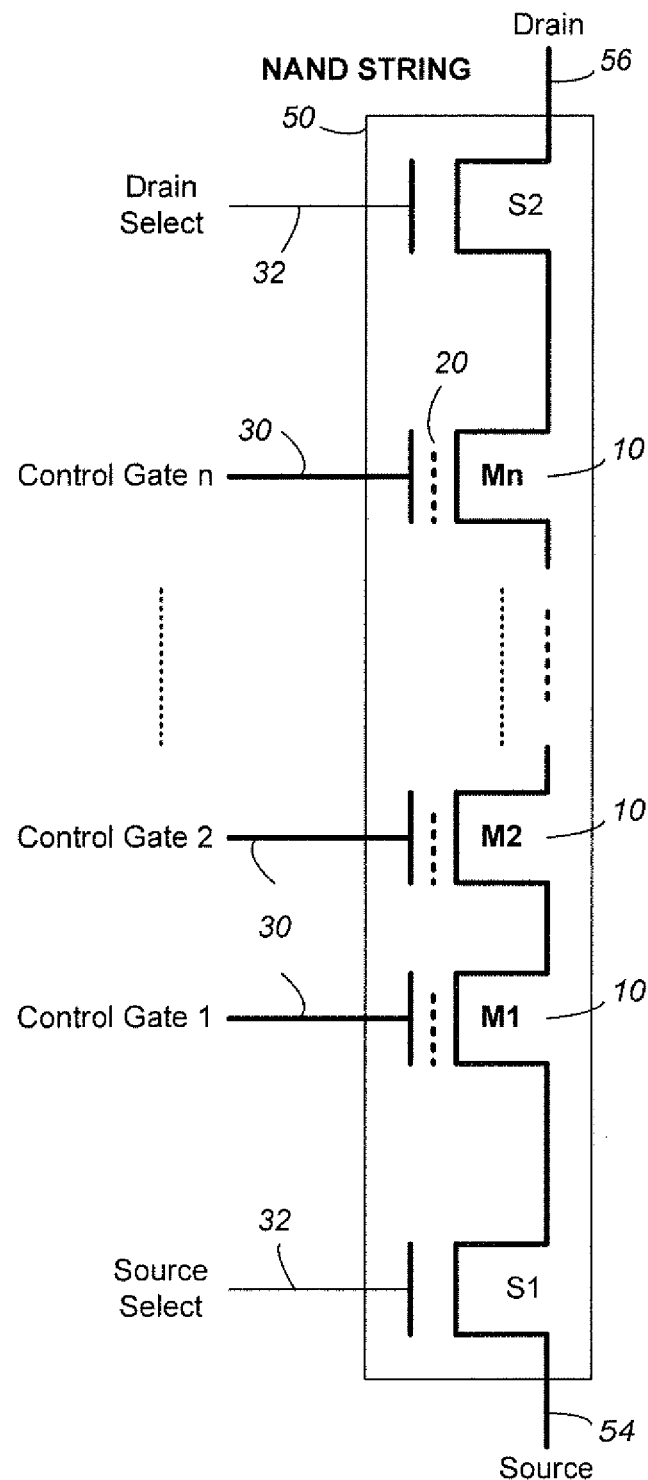
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
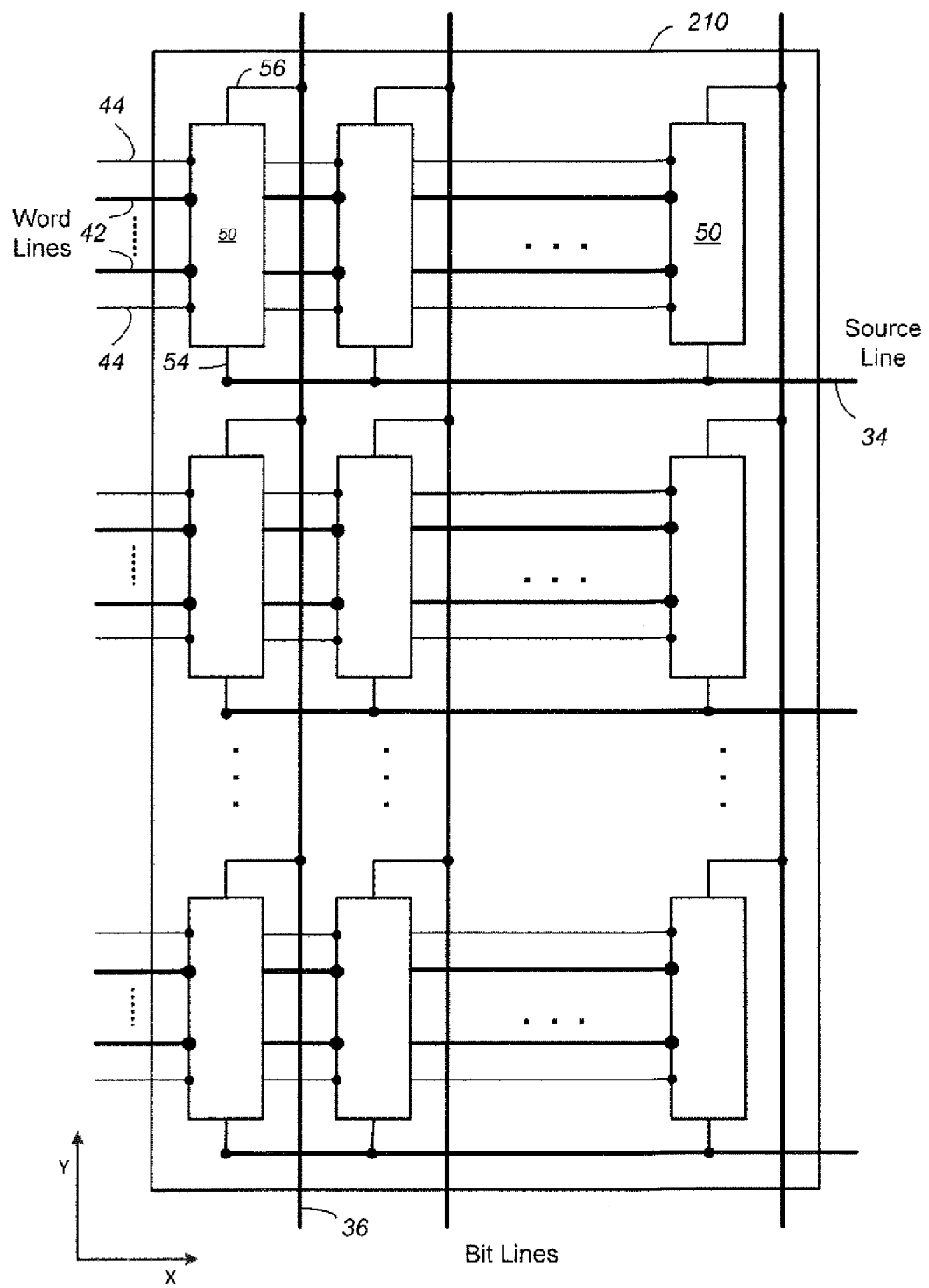
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
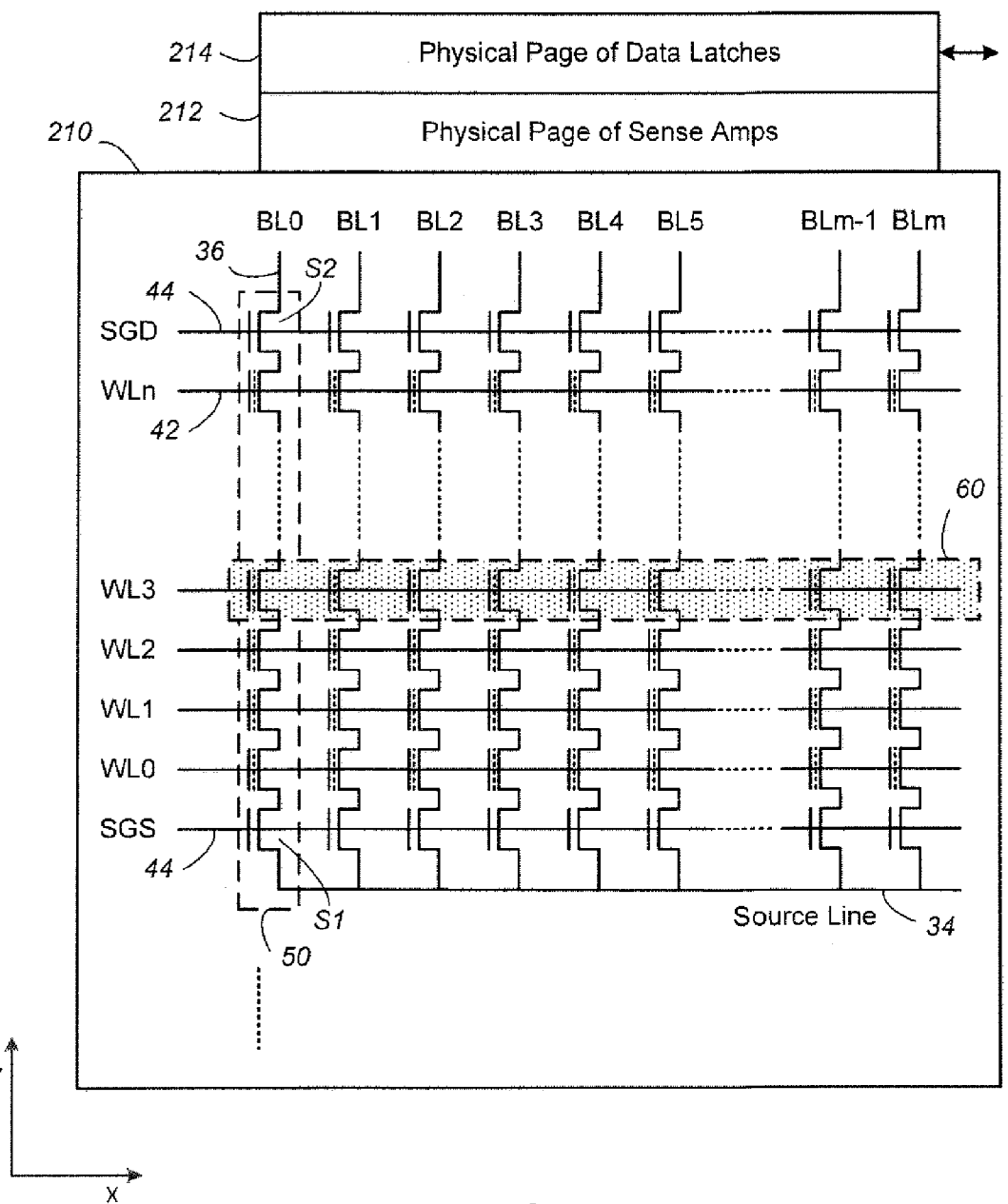
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate (or other charge storage element, e.g. charge trapping layer) must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the charge storage element and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
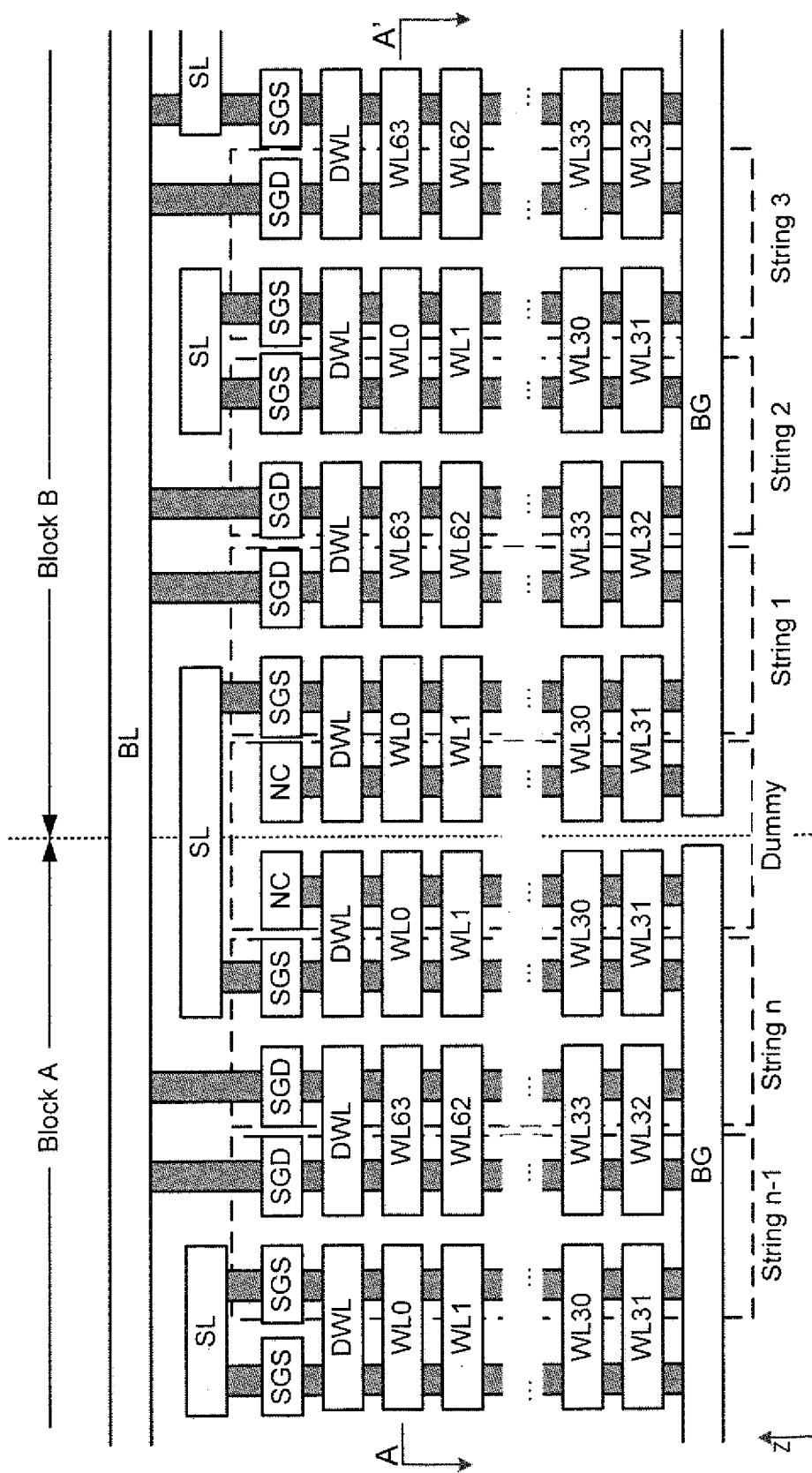
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data. In particular, the word line closest to the select gate may be vulnerable to data disturbance because of its proximity to the select gate. By making this word line a dummy word line, the danger of disturbing host data is reduced. In some cases, two or more dummy word lines may be provided between a select line and host data word lines because the risk of disturbance extends more than one word line from the select line. Dummy word lines may be located at other locations besides the single location shown. One or more dummy word lines may be located between host data word lines and the back gate ("BG") for example. Dummy word lines generally have the same physical structure as host data word lines so that the number and location of dummy word lines may be configurable for any given array structure.

Where Block A and Block B meet, there are dummy memory cells in both blocks (i.e. between String n of Block A and String 1 of Block B). A wing of a NAND string of dummy cells is provided in each block in this example so that host data word lines of the two blocks are separated by two dummy word lines. This is to reduce disturbance that might occur if host data word lines of different blocks were immediately adjacent to each other. Dummy select lines, which are not connected to control circuits (marked "NC" for "not connected") are also provided where neighboring blocks meet in this example. Different arrangements of dummy word lines, and other dummy structures between blocks are possible according to memory design and operating requirements. For example, select lines may be connected, back gates of neighboring blocks may be in closer proximity than shown, dummy word lines may be connected in different ways, etc.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Figure 9B:
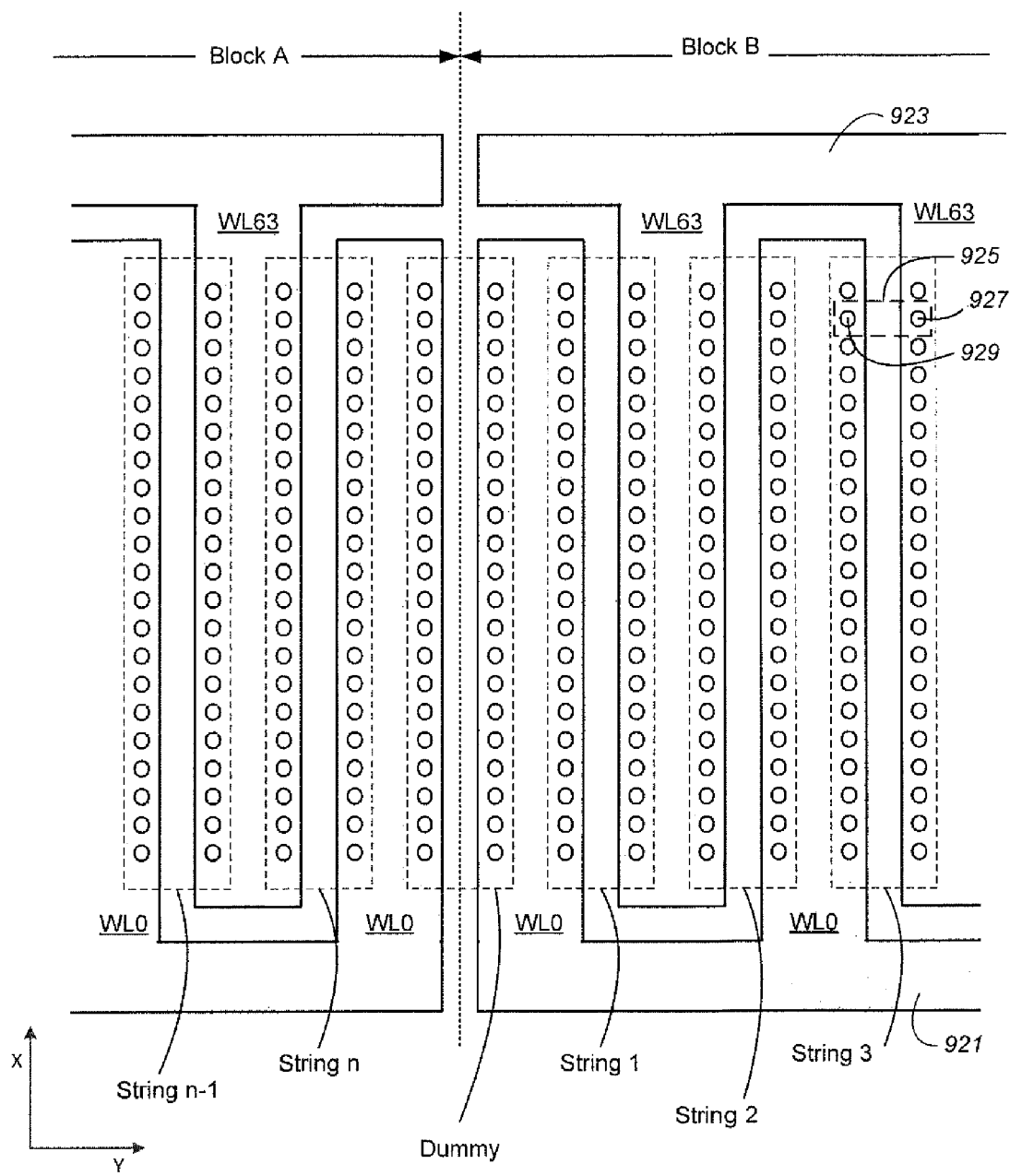
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the y-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines. A Back Gate (not shown in FIG. 9B) extends under the word lines of Block B to control all BG transistors of all strings in the block. When an appropriate bias is applied to the BG of Block B, the back gate transistor of string 925 and back gate transistors of all other similar strings indicated by "String 3" turn on to enable accessing of memory cells of String 3

Figure 10A:
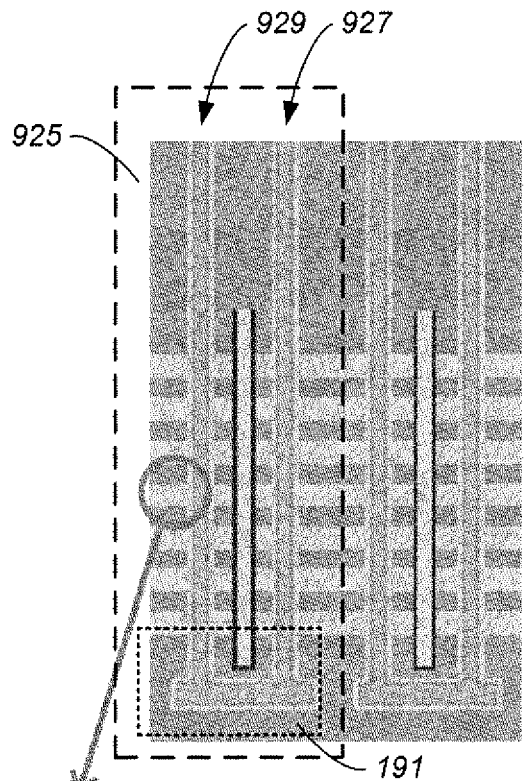
FIGS. 10A-10C show examples of structures of NAND strings.

FIG. 10A shows a cross section along a y-z plane that intersects memory holes 927, and 929 of NAND string 925 so that the structures formed within memory holes may be clearly seen. FIG. 10A shows that memory holes 927 and 929 are connected together at the bottom so that the two wings may be electrically connected in series.

Figure 10B:
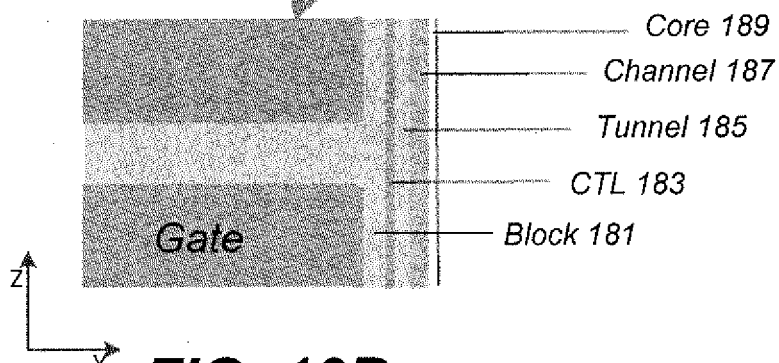

FIG. 10B shows the structure of a stack of layers in the memory hole 929 where memory cells are formed. It can be seen that a blocking dielectric "Block" 181 is deposited on the walls of the memory hole to provide electrical isolation. A Charge Trapping Layer (CTL) 183 is deposited on the blocking dielectric 181. The CTL layer 183 forms charge storage elements where the CTL is in close proximity to polysilicon word lines. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

When a NAND string is made using a memory hole, layers are deposited within the cylindrical memory hole so that the memory hole is filled in a substantially uniform manner with all deposited layers being present in at all levels (though some variation in memory hole diameter and other dimensions may occur). In contrast to planar NAND, where films deposited on a substrate surface can be patterned by photolithography, films deposited within a memory hole are generally not exposed in a manner that allows such patterning. As a result, charge storage elements formed by a charge trapping layer may be present in select transistors. To deal with this, select transistors may be managed in a way that maintains their characteristics within desirable ranges. Examples of such management are described in U.S. patent application Ser. No. 13/801,800, filed on Mar. 13, 2013.

Back Gates

Back gate transistors are typically formed by depositing the same layers that fill memory holes in a tube that extends between memory holes of a NAND string. The tube may be farmed using a sacrificial material that is etched away by a selective etch. The tube may be formed in a layer of the substrate that is appropriately doped, or within a layer of conductive material that overlies the substrate, so that the material enclosing the tube forms an electrically conductive gate of the back gate transistor. The layer of conductive material may form a common gate of all back gate transistors of a block. The layer may be patterned so that back gates of neighboring blocks are not connected, i.e. each block contains a portion of the conductive layer that is isolated from portions of other blocks. Each such portion may be separately connected to a peripheral circuit to allow control of back gates on a block by block basis.

Figure 10C:
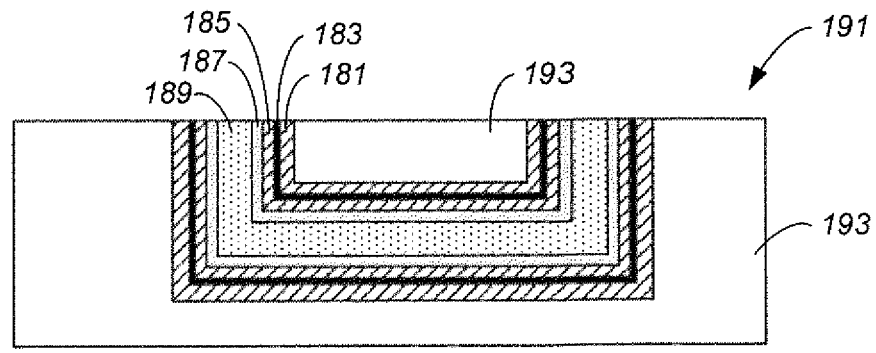

FIG. 10C shows a cross section of a back gate transistor 191 of NAND string 925 including the stack of materials that fill the tube within the back gate layer 193 (the same stack as in memory hole 929). Core material 189 fills the center of the tube, with channel layer 187 surrounding the core material. Tunnel dielectric 185 isolates the channel from a CTL layer 183. The block dielectric 181 separates the CTL layer from the back gate layer 193. It will be understood that while the geometry is different, the stack of layers of FIG. 10C is the same as FIG. 10B and is formed by the same series of process steps. It will be further understood that the stack extends along all inner surfaces of memory holes and connecting tubes i.e. stack is substantially cylindrically symmetric about core material 189. Examples of methods of forming such structures are disclosed in U.S. Patent Publication No. 2012/0220088.

It can be seen from FIG. 10C that back gate transistor 191 formed in the back gate BG contains a charge trapping layer that may acquire charge that may change the threshold voltage of the back gate transistor. While the back gate transistor is not used to store user data and is therefore not subject to programming, reading, or erasing operations, like a memory cell, the charge trapping layer within the back gate transistor may acquire charge as a result of operations directed at memory cells along the NAND string so that its characteristics may change over time.

Figure 11:
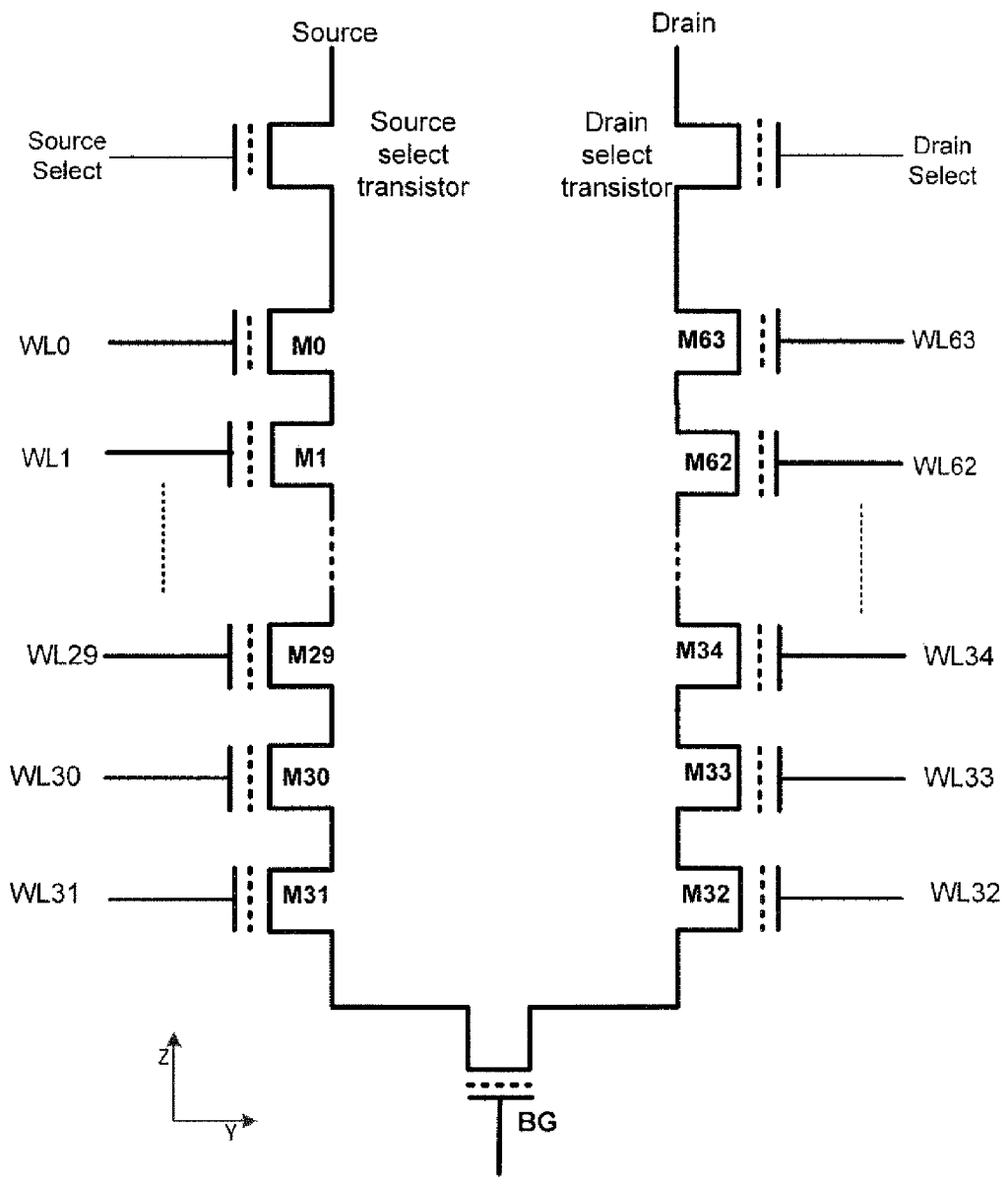
FIG. 11 is a schematic of a NAND string with two wings connected by a back gate.

FIG. 11 shows a schematic of a U-shaped NAND string including a back gate transistor (BG) connected in series between the wings of the NAND string to allow the two wings to be electrically connected. The back gate transistor contains a charge storage element (similar to memory cells). Over time, the threshold voltage of the back gate transistor may change and this change may affect operations that access memory cells along the NAND string connected to the back gate transistor. In general, a back gate transistor may have a desirable range of threshold voltage that facilitates access to memory cells that are connected in series with it. Deviation from this desirable range may cause problems.

When the threshold voltages of back gate transistors are higher than desirable this may result in programming errors. In some programming schemes, a relatively low voltage (close to the desirable threshold voltage range) is applied to a back gate during programming in order to minimize Bit Error Rate (BER). A set of programming conditions may include a relatively low voltage applied to the back gate in order to reduce disturbance of programmed data and to provide appropriate boosting of channel voltage (such a voltage may be part of a boosting scheme and may be considered a boosting voltage). In particular, a low voltage may be applied to a back gate when programming memory cells that are close to the back gate. For example, in FIG. 11, programming of memory cells that are close to back gate BG on the source side (i.e. between the BG and source), such as M29-M31 may be performed using programming conditions that include a low voltage applied to the back gate. A higher voltage may be applied to the back gate when programming memory cells that are farther away from the back gate (e.g. M0-M28 and M35-M63). An area of a three dimensional memory array that is close to the back gate may be referred to as a "lower layer zone." While in this example the lower layer zone consists of three layers (lowest layer containing WL31 and WL32, next layer containing WL30 and WL33, and next layer containing WL29 and WL34), the lower layer zone may include any suitable number of layers in order to obtain a low BER. In some cases, programming proceeds from the source end to the drain end of the NAND string in order of word lines (e.g. from WL0 to WL63) and a low voltage is applied to the back gate when programming word lines between the back gate and the source (i.e. before word lines between the drain and the back gate are programmed). For example, in FIG. 11, a low voltage is applied to the BG during programming of M31 in order to reduce disturbance of data along WL31. At this point, memory cells M0-M30 are already programmed which may increase resistance of the NAND string between the source and M31. This makes a good connection through the back gate particularly important. If resistance of the NAND string on the drain side of M31 is also increased by the back gate, then the channel of M31 may not be adequately controlled to allow reliable programming. In contrast, when programming memory cells on the drain side of the back gate (e.g. M32) there are only unprogrammed memory cells (M33-M63), and no back gate, between the drain and the cell being programmed so that channel voltage may be adequately controlled.

In general, programming conditions are optimized to provide a low Bit Error Rate (BER) in a given memory. Such optimization may be based on assuming that back gate threshold voltage is in a particular range, which may not be a valid assumption for some cases, particularly where a memory, or a block within a memory, has experienced significant wear (a significant number of write-erase cycles). While dummy memory cells may be provided to reduce interaction between the back gate and host data memory cells, this reduces capacity available for host data, and may not eliminate interaction.

Where such low voltage that is close to the back gate transistor threshold voltage is applied to the back gate during programming of nearby memory cells, elevated back gate transistor threshold voltage may be indicated by a pattern of programming failures along word lines close to the back gate, particularly between the source and back gate. In other examples the number of cycles of voltage pulses followed by verification (loop count) needed for lower level zone programming may provide an indication of increased back gate threshold voltage. Increased loop count for these word lines may be an early indicator of back gate threshold voltage increase. Such increased back gate transistor threshold voltage may be caused by charge becoming trapped in a charge trapping layer within the back gate.

Figure 12A:
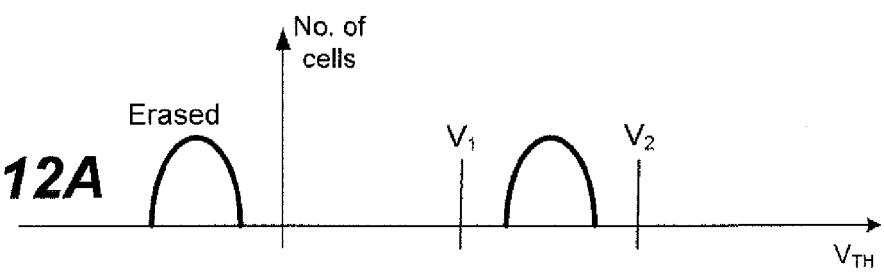
FIG. 12A-D show examples of threshold voltage distributions for back gate transistors.
Figure 12B:
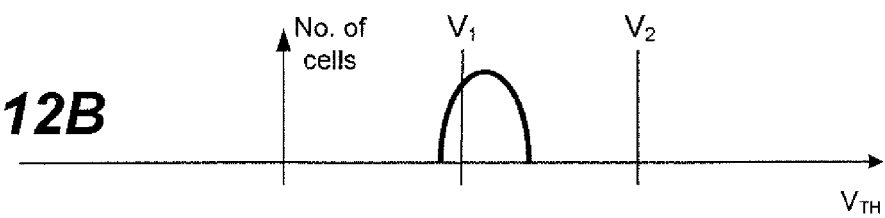
Figure 12C:
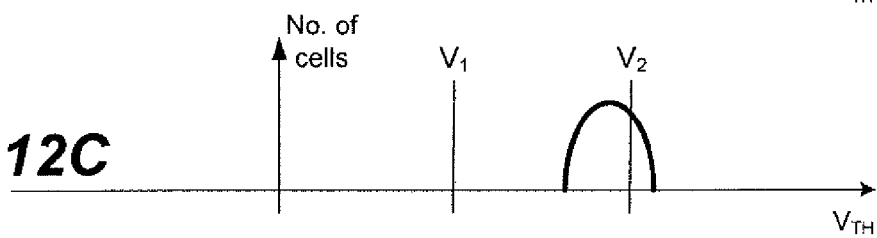
Figure 12D:
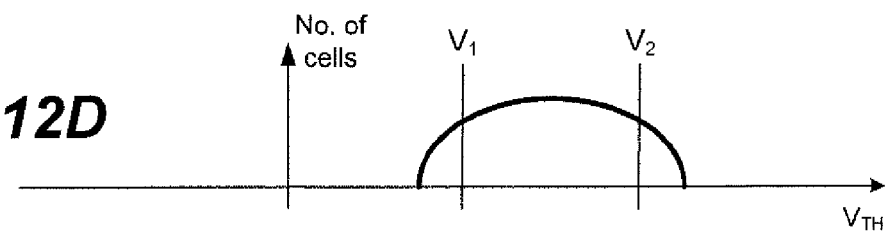

In some cases, the threshold voltage of a back gate transistor may be tuned to a desired range so that if the threshold voltage becomes elevated, it can be returned to a desired range. Examples of such back gate transistor tuning are described in U.S. patent application Ser. No. 13/927,659, entitled "SYSTEM FOR MAINTAINING BACK GATE THRESHOLD VOLTAGE IN THREE DIMENSIONAL NAND MEMORY", filed on Jun. 26, 2013, which is hereby incorporated by reference in its entirety. FIG. 12A shows an example of a distribution of back gate transistors in a desirable threshold voltage range that is between $V_1$ and $V_2$. If back gate transistors lose charge (threshold voltage distribution shifts down) as shown in FIG. 12B or gain charge (threshold voltage distribution shifts up) as shown in FIG. 12C, or if back gate transistors have random changes in charge levels (threshold voltage distribution becomes wider) as shown in FIG. 12D then problems may occur.

The threshold voltage may be monitored periodically during the lifecycle of the memory (e.g. based on a time stamp or other time indicator), or may be monitored in response to some triggering event. Hot count (the number of write/erase cycles) may be used to trigger monitoring. For example, back gate transistors may be monitored every N cycles (e.g. every 1000 cycles). Alternatively, monitoring may be performed in response to increasing numbers of ECC errors so that when the number of ECC errors exceeds a threshold number then monitoring is performed. Other triggering events may also be used including a pattern of program failures, or an increase in loop count when programming word lines near the back gate.

Back gate tuning may provide a solution to elevated threshold voltages in back gate transistors in many cases. Back gate transistor threshold voltage may be maintained within a desired range by performing tuning when the threshold voltage goes outside the desired range. However, in some cases, back gate transistor tuning may not provide an adequate solution. For example, in heavily worn back gate transistors, it may not be possible to restore the threshold voltage to the desired range. It is known that memory cells that have experienced a large number of write-erase cycles may suffer from erase saturation, which prevents them from being fully erased. Significant charge remains in charge storage elements of such memory cells even after an erase operation. A similar phenomenon may occur in back gate transistors that have experienced significant wear. It may not be practical or possible to remove sufficient charge from such transistors to return them to a desirable threshold voltage range. While back gate threshold voltage may be maintained in a desired range by periodic tuning over an initial period of operation of the memory, at some point this may no longer be possible.

According to an aspect of the present invention, when the threshold voltages of back gate transistors become elevated, programming conditions may be modified to accommodate the elevated threshold voltages. This approach may be used instead of back gate transistor tuning, or in combination with back gate transistor tuning. According to an example, back gate transistor tuning is used to maintain back gate threshold voltage in a desired range for a period of time and then, when tuning is no longer effective in returning threshold voltage to the desired range, programming conditions are modified to accommodate the elevated threshold voltage range. The elevated threshold voltage range may then be considered as a new desirable threshold voltage range, with transistor tuning used to maintain threshold voltage in the elevated range. This sequence may be repeated with tuning used to maintain threshold voltage in a given range until it is no longer effective, then modification of programming parameters used to accommodate a new higher threshold voltage range, which is again maintained by tuning for as long as it can be effectively performed.

Figure 13:
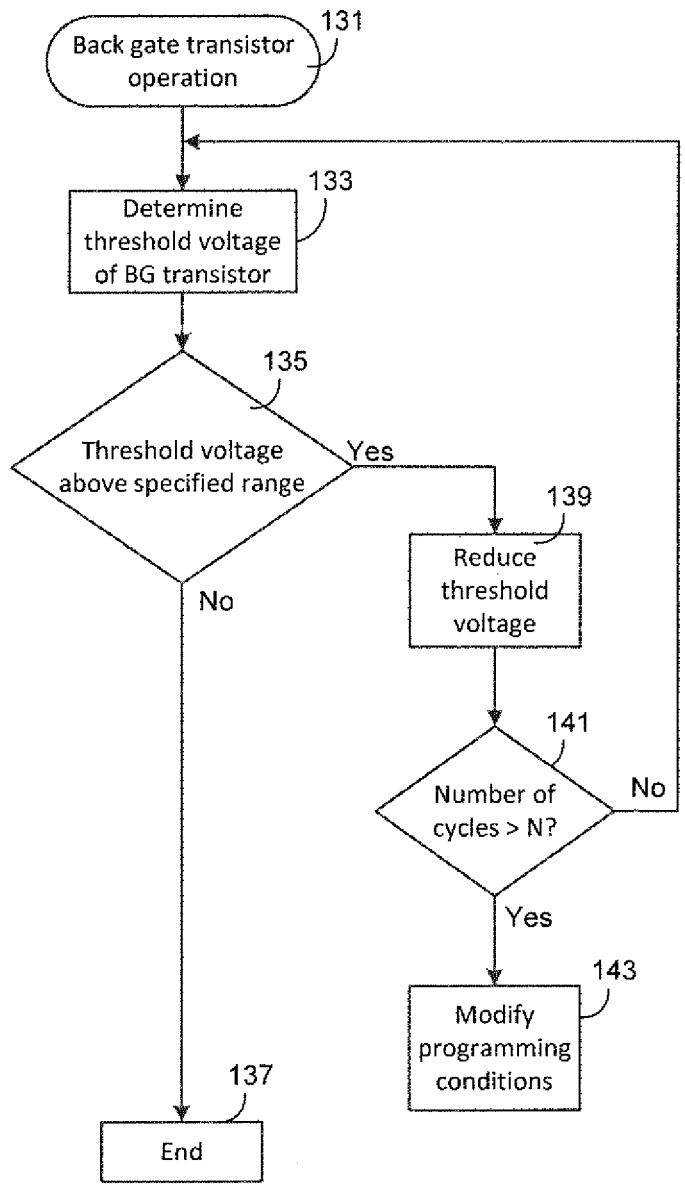
FIG. 13 illustrates a scheme for back gate transistor operation.

FIG. 13 illustrates a method of operating back gate transistors 131. In general, this operation takes place in response to some triggering event and only takes place after any valid data in the block is copied to another block so that it is safe. A determination of back gate threshold voltage is made 133. This may be performed in a similar manner to reading of a memory cell. Subsequently, the threshold voltage may be compared with a specified threshold voltage range to determine if it is above the range 135. If the threshold voltage is not above the specified range, then the operation may end 137 (another operation may determine if the threshold voltage is below the specified range and take appropriate action). If the threshold voltage is above the specified range then a threshold voltage reduction step occurs 139. The reduced threshold voltage may be determined 133 and compared with the specified range 135 to see if it is still above the specified range. This cycle may be repeated up to some maximum number of cycles 141 (N cycles in this example). After N cycles of attempting to reduce threshold voltage back to the specified range another approach may be used. Specifically, programming conditions may be modified 143 to accommodate the higher threshold voltage of the back gate transistors. For example, a default set of process conditions that was adapted for use with back gate transistors in the specified range may be replaced with a modified set of process conditions that is adapted for use with back gate transistors having higher threshold voltages than the specified range. Such a modified set of process conditions may be tested to see if data can be successfully programmed using the modified set. If it is successful then all subsequent programming may use the modified set of process conditions.

Figure 14:
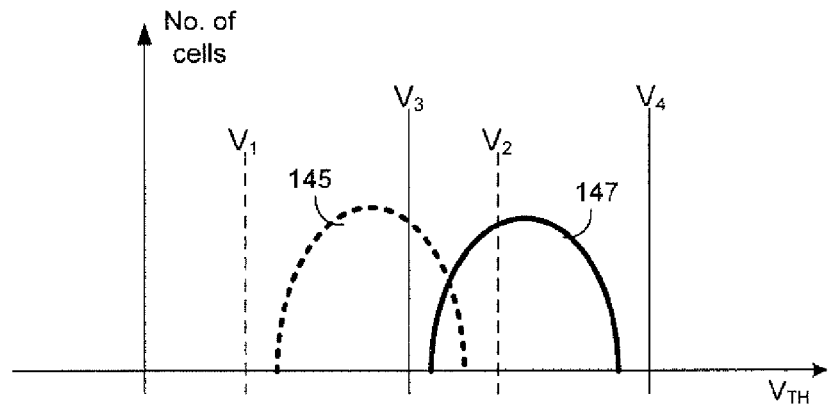
FIG. 14 illustrates back gate transistor threshold voltage change.

FIG. 14 illustrates increased back gate transistor threshold voltage after some use. A first distribution 145 shows memory cells in a specified range between V1 and V2 (similar to FIG. 12A). A second distribution 147 shows memory cells in a distribution that leaves a significant number of memory cells with threshold voltages that are higher than the specified range (i.e. above V2). In some cases it is not possible, or not efficient, to return threshold voltages of such memory cells to the specified range. Instead, programming conditions for the memory array, or for a block, are modified for operation with the higher back gate transistor threshold voltage range, for example a range between V3 and V4.

While voltage V2 may be sufficient to turn on all transistors with the first threshold voltage distribution 145, it is not sufficient to turn on all transistors with the second distribution 147. Where V2 is used to bias a back gate when memory cells have the first distribution, it may be replaced with a higher voltage such as V4 when the memory cells have the second distribution. It can be seen that V4 is higher than the second distribution 147 and is sufficient to turn on all back gate transistors within the second distribution. Where V2 or a similar voltage is applied to the back gate during programming of at least some word lines when back gate transistors are in the first distribution, V2 may be replaced by V4 or a similar voltage when the back gate transistors have the second distribution.

In some cases, after the programming parameters are modified to accommodate the increased back gate transistor threshold voltage distribution, the back gate transistors are subsequently maintained so that their threshold voltages remain in the increased distribution. For example, back gate transistor threshold voltage may be maintained in a range such as between V3 and V4 so that the back gate transistor threshold voltages correspond to the modified programming parameters. Periodic tuning of back gate transistor threshold voltage may be performed to maintain back gate transistor threshold voltage within this range, and not within the original range between V1 and V2. Such adaptation may occur more than once so that if the distribution of back gate transistor threshold voltage becomes higher and cannot conveniently be returned to the modified range then yet another set of programming conditions may be used that is adapted to this higher range. Programming conditions may adapt to changing back gate transistor threshold voltage multiple times throughout the life cycle of a memory system. In some cases, back gate transistor threshold voltage may be maintained within specified ranges between such adaptations so that adaptation occurs as a relatively small number of discrete events. In other examples, adaptation may be performed more frequently with small increments in programming conditions in response to changing back gate threshold voltages.

Figure 15:
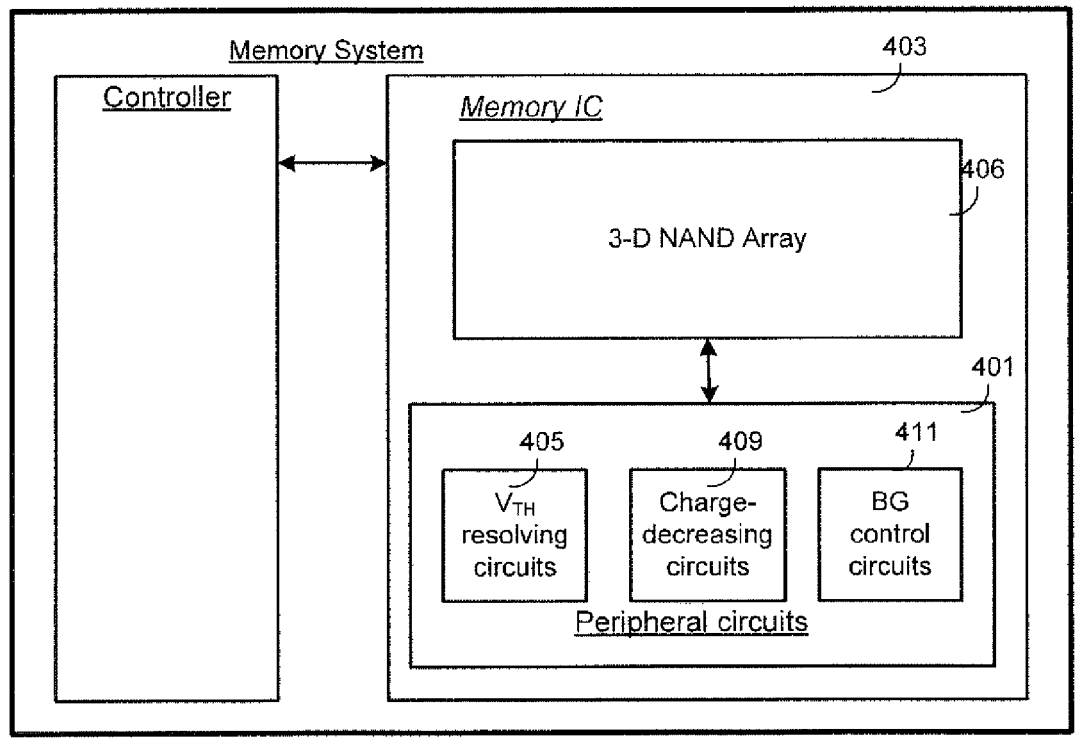
FIG. 15 shows an example of hardware for operating back gate transistors.

Various hardware may be used to carry out aspects of the present invention. FIG. 15 shows one example where peripheral circuits 401 on a memory chip 403 include threshold voltage resolving circuits 405 to resolve the threshold voltages of back gate transistors in a 3-D NAND array 406 (different embodiments may have one or more). Such circuits may be similar in configuration to reading circuits used to read memory cells. Also shown are charge-decreasing circuits 409, which may be for decreasing charge stored in back gate transistors. Charge-decreasing circuits may be similar to erase circuits used to erase memory cells and in some cases these circuits may be combined. Charge-decreasing circuits may be considered as threshold voltage modification circuits. Back gate control circuits 411 are connected to back gates of individual blocks and provide the appropriate voltages to back gates to carry out the operations described above. In particular, back gate control circuits 411 may be adaptive so that, for the same operation (e.g. programming of adjacent word line) different voltages are employed during a first period and a second period. Such adaptive back gate control circuits modify the voltage applied to the back gate in response to changing back gate threshold voltage.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method comprising:
applying a first set of programming conditions that includes applying a first back gate voltage to a back gate of a block for programming operations during a first period of operation;
performing one or more back gate tuning operations on the back gate, the back gate tuning operation configured to set a threshold voltage of a back gate transistor to be in a target range;
subsequently determining that the threshold voltage of the back gate transistor remains higher than the target range after performing the back gate tuning operations; and
subsequently, replacing the first set of programming conditions with a second set of programming conditions that includes applying a second back gate voltage to the back gate of the block for programming operations during a second period of operation, the second back gate voltage being larger than the first back gate voltage.

2. The method of claim 1 wherein the first back gate voltage is applied to the back gate when programming one or more word lines near the back gate that are located between the back gate and a source line during the first period of operation.

3. The method of claim 2 wherein the second back gate voltage is applied to the back gate when programming the one or more word lines near the back gate that are located between the back gate and the source line, during the second period of operation.

4. The method of claim 1 wherein the first set of programming conditions are maintained for as long as the threshold voltage of the back gate transistor is found to be within the target range immediately after a back gate tuning operation.

5. The method of claim 1 further comprising: performing one or more back gate tuning operations on the back gate of the block to maintain threshold voltage of the back gate in a modified target range during the second period of operation.

6. The method of claim 5 further comprising: subsequently determining that the threshold voltage of the back gate transistor remains higher than the modified target range after back gate tuning; and
subsequently, replacing the second set of programming conditions with a third set of programming conditions that includes a third back gate voltage that is applied to the back gate of the block for programming operations during a third period of operation, the third back gate voltage being larger than the second back gate voltage.

7. The method of claim 6 wherein the first back gate voltage is insufficient to turn on back gate transistors with threshold voltages within the modified target range, and the second back gate voltage is insufficient to turn on back gate transistors with threshold voltages higher than the modified target range.

8. The method of claim 1 wherein the first set of programming conditions is optimized to produce a low Bit Error Rate (BER) in a new memory array and the second set of programming conditions is not optimized to produce a low BER in a new memory.

9. The method of claim 8 wherein the second set of programming conditions allows programming of data along word lines that cannot be programmed using the first set of programming conditions after a period of use of the memory array.

10. An apparatus comprising:
a back gate control circuit configured to apply a default set of programming conditions that includes a first back gate voltage that is applied to a back gate of the block for programming cells along word lines near the back gate during a first period of operation;

a threshold voltage resolving circuit configured to determine if the threshold voltages of back gate transistors are higher than a target range; and the back gate control circuit further configured to replace the default set of programming conditions with a modified set of programming conditions that includes a second back gate voltage that is applied to the back gate of the block for programming cells along word lines near the back gate during a second period of operation, the second back gate voltage being larger than the first back gate voltage.

11. The apparatus of claim 10 wherein the first back gate voltage is sufficient to turn on back gate transistors that have threshold voltages within the target range and is insufficient to turn on back gate transistors that have threshold voltages higher than the target range.

12. The apparatus of claim 11 wherein the second back gate voltage is sufficient to turn on back gate transistors that have threshold voltages higher than the target range.

13. The apparatus of claim 10 wherein the back gate control circuits are further configured to perform one or more back gate transistor threshold voltage modification operations to maintain threshold voltage of back gate transistors within the target range.

14. The apparatus of claim 10 wherein the back gate control circuits are further configured to identify a pattern of programming failures when programming word lines near the back gate that are located between the back gate and a source line prior to replacing the default set of programming conditions.

15. A system comprising:
a plurality of NAND strings that individually include two wings that each extend in a direction perpendicular to a surface of a substrate, the two wings connected by a back gate transistor;

a back gate configured to form a common gate terminal for each back gate transistor of a block; and a back gate control circuit configured to control a voltage applied to the back gate, the back gate control circuit configured to supply a first boosting voltage to the back gate during a first plurality of memory cell programming operations and configured to subsequently supply a second boosting voltage to the back gate during a second plurality of memory cell programming operations, the second boosting voltage being higher than the first boosting voltage.

16. The system of claim 15 wherein the back gate control circuit is configured to supply the first and second boosting voltages to the back gate during programming of word lines near the back gate that are between the back gate and a source terminal.

17. The system of claim 15 further comprising a back gate threshold voltage modification circuit that is configured to modify threshold voltages of back gate transistors.

18. The system of claim 17 further comprising a back gate threshold voltage resolving circuit that is configured to resolve threshold voltages of back gate transistors.

* * * * *